United States Patent [19]

McClure

[11] Patent Number: 5,019,724

[45] Date of Patent: May 28, 1991

[54] NOISE TOLERANT INPUT BUFFER

[75] Inventor: David C. McClure, Carrollton, Tex.

[73] Assignee: SGS-Thomson Microelectronics, Inc., Carrollton, Tex.

[21] Appl. No.: 453,589

[22] Filed: Dec. 20, 1989

[51] Int. Cl.[5] .......................... H03K 5/22; H03K 17/16
[52] U.S. Cl. ..................................... 307/443; 307/592; 307/594
[58] Field of Search ............ 307/443, 592, 594, 542.1, 307/272.2, 601, 480, 481, 265

[56] References Cited

U.S. PATENT DOCUMENTS

| 4,710,648 | 12/1987 | Hanamura et al. | 307/443 |
| 4,717,835 | 1/1988 | Takeuchi | 307/480 |
| 4,760,279 | 5/1988 | Saito et al. | 307/443 |

FOREIGN PATENT DOCUMENTS 0032824  4/1981  Japan .................... 307/443

*Primary Examiner*—David Hudspeth
*Assistant Examiner*—Andrew Sanders
*Attorney, Agent, or Firm*—Dennis T. Griggs; Richard K. Robinson

[57] ABSTRACT

An input buffer interface circuit provides high state and low state input noise tolerance by a tri-state CMOS inverter having high state and low state inputs which are driven conditionally after the propagation of an input signal through predetermined high state and low state delay circuits. In one embodiment, a resettable high state delay circuits is provided by a cascaded combination of NOR gates and inverters, whereby the delay is preempted automatically by an excursion from high to low with the result that the delay path is reinitialized automatically for rejection of successive high state ringing fluctuations. A resettable low state delay circuit is provided by a cascaded combination of NAND gates and inverters.

16 Claims, 2 Drawing Sheets

NOISE TOLERANT INPUT BUFFER

FIELD OF THE INVENTION

This invention relates generally to integrated circuits, and in particular to noise tolerant interface circuits.

BACKGROUND OF THE INVENTION

Electronic data processing systems employ complex manipulations of data and instruction words stored in memory which involve the transfer of logic signals from one circuit subsystem to another. The effect of spurious noise, for example, supply voltage variations and input variations induced by switching transients, has become an increasingly important design consideration, particularly in circuits in which analog and digital subsystems are interfaced in an integrated circuit, and where transistor-transistor logic (TTL) circuits are coupled in driving relation to metal-oxide-semiconductor (MOS) circuits.

TTL logic circuits generate current transients or spikes because of their stacked output structure. When the output of a TTL logic circuit is switching from the low state to the high state, there is a short interval of time during the switching transition where the switching transistors are conducting and a relatively large surge of current (30–50 mA) is drawn from the +5 volt supply ($V_{cc}$). The duration of this current transient is extended by the effects of any load capacitance on the circuit output. The load capacitance includes stray wiring capacitance and the input capacitance of any load circuits and will be charged up to the high state output voltage. Consequently, when a TTL output circuit goes from low to high, a high-amplitude current spike will be drawn from the $V_{cc}$ supply.

In a complex digital circuit, there may be many TTL outputs switching states at the same time, with each one drawing a narrow spike of current from the power supply. The cumulative effect of all these current spikes will be to produce a voltage spike on the common $V_{cc}$ line, mostly due to the distributed inductance on the supply line. Moreover, stray electrical and magnetic fields can induce spurious voltages on the connecting wires between logic circuits. These unwanted, spurious signals can sometimes cause the voltage at the input to a logic circuit to drop below $V_{IH}$ (MIN) or rise above $V_{IL}$ (MAX), which can produce unpredictable operation.

For example, spurious noise on supply voltage or coupling of signals between adjacent input pins can result in falsely interpreted input signals. $V_{IH}$ may become $V_{IL}$ for a moment, which can falsely trigger counters, shift registers, pointers and the like. This is a non-recoverable event and can cause catastrophic consequences such as inhibiting or masking of valid data or instruction words or the transmission of an erroneous data or instruction word.

The input voltage requirements of a logic circuit are illustrated in FIG. 2. The logic circuit will respond to any input voltage greater than $V_{IH}$ (MIN) as a logic 1, and will respond to voltages lower than $V_{IL}$ (MAX) as a logic zero. Input voltages in the indeterminate range will produce an unpredictable response and should not be allowed. When a logic high output is driving a logic circuit input, a negative noise spike appearing on the signal line may cause the input voltage to drop into the indeterminate range. When a logic low output of one circuit is driving a logic input of another circuit, a positive noise spike on the signal line can drive the input voltage into the indeterminant range, where an unpredictable operation can occur.

DESCRIPTION OF THE PRIOR ART

Logic circuits are frequently designed which maximize speed, but which have increased noise sensitivity when used in a high speed environment. Some fast components cannot be successfully interfaced with slower logic circuits because of the spurious noise which is inherent in the operation of such circuits, for example, TTL logic circuits and analog circuits which have switched capacitors.

When two such circuits are interfaced, it is difficult to prevent the noise caused by supply voltage variations in one logic circuit from introducing noise into the other logic circuit. Such supply voltage variations, whether deriving from causes within or external of the integrated circuit itself, may be superimposed onto the logic signal input to the other circuit. The advantages of using certain high speed logic circuits would be completely offset if the noise caused by supply voltage variations and other spurious noise effects were coupled to the input of the driven logic circuit.

One solution to the problem of noise sensitivity to supply sources, used specifically with logic circuits having high sensitivity, involves the use of a differential output buffer to cancel the effect of noise in the output signal. Such a solution leads to design restrictions and higher fabrication costs.

Another solution for suppressing the voltage spike caused by TTL logic circuit output transitions is decoupling the power supply by connection of a capacitor across $V_{cc}$ to ground to suppress high frequency spikes. However, the discrete capacitor has conductor leads which may introduce substantial inductance into the circuit, thereby degrading its speed performance.

Accordingly, a noise tolerant input buffer is needed which can render a noise sensitive logic circuit usable in combination with an inherently noisy logic circuit or usable in a network which is otherwise subject to spurious noise effects.

SUMMARY OF THE INVENTION

Input noise tolerance is provided in an input buffer interface circuit by a tri-state CMOS inverter having high state and low state inputs which are driven conditionally after the propagation of the input signal through a predetermined delay.

High state noise tolerance is realized by applying the input voltage signal through a ratio inverter to one input of a NOR gate, and by propagating the inverted input signal through a non-inverting delay circuit and applying the delayed signal to a second input of the NOR gate. After the delay interval, the delay input of the NOR gate transitions from logic high to logic low level, with the result that the NOR gate output transitions from low to high, and consequently driving CMOS inverter from high to low. Accordingly, high-to-low noise fluctuations having a duration less than the predetermined delay interval will be rejected and will have no effect on the operation of the CMOS inverter.

Low state noise tolerance is provided by conditionally applying the driving signal to the input of the CMOS inverter only after a predetermined low state delay interval. In this arrangement, the input signal is applied through a ratio inverter, and the inverted input signal is propagated through a non-inverting delay circuit to one input of a NAND gate, and the inverted input signal is also applied directly as a second input to the NAND gate. Low-to-high noise fluctuations occurring at the input which have a duration less than the predetermined low state delay interval are rejected.

In one embodiment, a high state delay circuit is provided by a cascaded combination of NOR gates and inverters. One input of each NOR gate is connected in common to the driving signal, whereby the delay is preempted automatically by an excursion from high to low on the input node with the result that the delay path is re-initialized automatically for rejection of successive high state ringing fluctuations.

In another embodiment, a low state delay circuit is provided by a cascaded combination of NAND gates and inverters. One input of each NAND gate is connected in common to the driving signal, whereby the delay is preempted automatically by an excursion from low to high on the input node with the result that the delay path is re-initialized automatically for rejection of successive low state ringing fluctuations.

Operational features and advantages of the present invention will be appreciated by those skilled in the art upon reading the detailed description which follows in connection with the attached drawings, wherein:

DETAILED DESCRIPTION OF THE PREFERRED EMBODIMENTS

Figure 1:
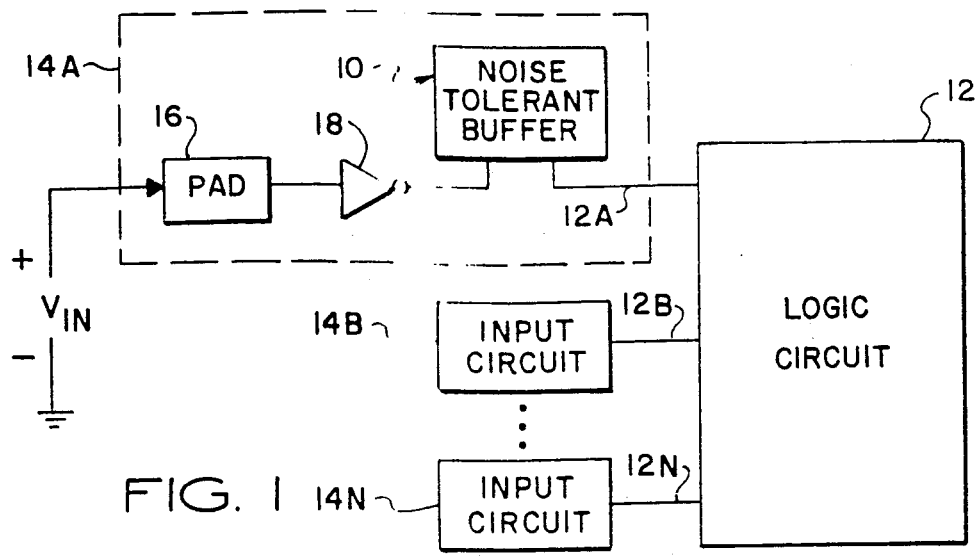
FIG. 1 is a block diagram which illustrates the insertion of a noise tolerant buffer circuit of the present invention between an input ratio inverter and a load circuit.

In the description which follows, like parts are indicated throughout the specification and drawings with the same reference numerals, respectively.

The noise tolerant input buffer 10 of the present invention may be employed with a wide variety of integrated circuit devices. FIG. 1 illustrates a general application of the noise tolerant input buffer 10 as an interface between a driver circuit (not illustrated) and a high speed logic circuit 12. The logic circuit 12 has multiple input circuits 14A, 14B, ..., 14N for receiving separate logic signals. Each input circuit includes an input pad 16 and a ratio inverter 18 connected in electrical series relation with a selected one of the logic circuit input nodes 12A, 12B, ..., 12N.

The high speed logic circuit 12 may be, for example, a memory device, a counter, clock, shift register, pointer or the like, implemented by complementary metal-oxide-semiconductor (CMOS) integrated circuit technology. The noise tolerant buffer 10 is preferably implemented on the same substrate with the high speed logic circuit 12, and is inserted in series with the input pad 16 and the ratio inverter 18. A logical "1" level which exceeds $V_{IH}$ (MIN), for example, +2.0 volts, or a logical "0" level which is less than $V_{IL}$ (MAX), for example +0.8 volts on the input pad 16, raises or lowers the potential on the input node 12A of the high speed logic circuit 12 accordingly.

The trip point of the ratio inverter 18 is selected according to the $V_{IN}$ (MIN) and $V_{IL}$ (MAX) values. In this example, $V_{IH}$ (MIN) is +2.0 volts, and $V_{IL}$ (MAX) is 0.8 volts. With these constraints, the trip point is selected to be somewhat less than $V_{IH}$ (MIN) to be confident that an input voltage of 2.0 volts will be recognized as a logic high level, and that an input voltage of 0.8 volts will be recognized as a low logic level. Accordingly, the trip point of ratio inverter 18 is centered between $V_{IL}$ (MAX) and $V_{IH}$ (MIN), in this example at +1.4 volts.

Figure 2:
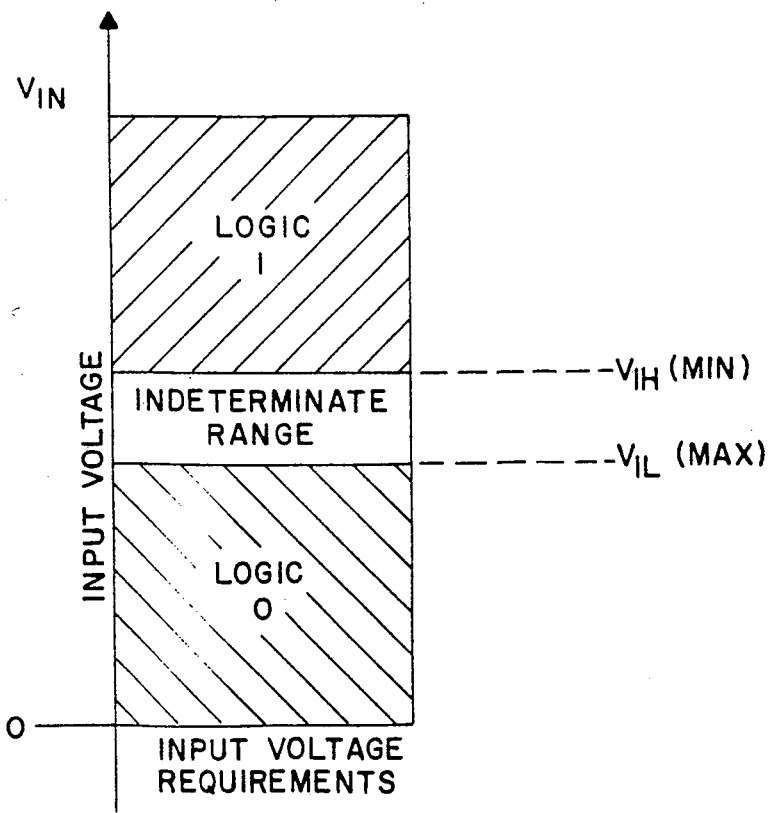
FIG. 2 is a diagram showing the logic transition voltage requirements at the input of the logic circuit of FIG. 1.

It will be appreciated that positive or negative noise spikes appearing on the input pad 16 or power supply nodes may cause the input voltage $V_{IN}$ to rise or fall into the indeterminate range (FIG. 2), where an unpredictable operation can occur. Such spurious noise may be inherent in the operation of the external driving circuit, for example, TTL logic circuits and analog circuits which have switched capacitors. Moreover, inductive coupling between adjacent input pins and pads may also induce spurious voltages which can cause the input voltage $V_{IN}$ to transition into the indeterminate range.

Positive or negative noise signals appearing on the input of pad 16 are rejected in the input buffer interface circuit 10 by a tri-state CMOS inverter 20 having a high state input node 22 and a low state input node 24. The high state input node 22 and low state input node 24 are driven conditionally after the propagation of the input signal through a predetermined high state delay path 26 or through a predetermined low state delay path 28.

The tri-state CMOS inverter 20 is formed by two P-channel enhancement mode MOS field effect transistors Q1 and Q2 and two N-channel enhancement mode MOS field effect transistors Q3 and Q4. MOSFET Q1 and MOSFET Q2 are connected in series such that the source of MOSFET Q1 is connected to $+V_{DD}$ and its drain is connected to the source of MOSFET Q2. The drain of MOSFET Q2 is connected in series with the drain of N-channel MOSFET Q3, and the source of MOSFET Q3 is connected in series with the drain of N-channel MOSFET Q4. The source of N-channel MOSFET Q4 is connected to ground ($V_{SS}$). The gates of P-channel MOSFET Q1 and N-channel MOSFET Q3 are connected together as one common gate input node 24. Likewise, the gates of Q2 and Q4 are connected together as a second common input node 22.

The inverter 20 is referred to herein as a tri-state inverter because it allows three possible output states at its output node 40: logic high, logic low and a high impedance state. The high impedance state is a condition where at least one P-channel MOSFET is turned off and at least one N-channel MOSFET is turned off so that the output node 40 is at a high impedance with respect to $V_{SS}$. That is, in the high state condition, node 40 is not being driven by the tri-state CMOS inverter 20. Inverter 54 maintains the preexisting voltage level on node 40.

The input buffer interface circuit 10 rejects spurious signals applied to the input pad 16 or noise injected through the supply voltage of the ratio inverter 18 by requiring that the input signal appearing at the output node 30 of the ratio inverter 18 subsist at a logic low or logic high level for a predetermined time interval which exceeds the expected duration of low state or high state noise signals. Accordingly, the delays introduced by the high state delay circuit 26 and the low state delay circuit 28 are selected to be longer in duration than the expected system noise signals. The delay circuits 26, 28 can be selected to provide five to ten nanoseconds of delay, for example, depending upon the characteristics of the noise to be rejected.

Referring again to FIG. 3, high state noise rejection is realized by applying the input voltage signal $V_{IN}$ through the ratio inverter 18 to produce an inverted input signal $\overline{V}_{IN}$ at the common input node 30. The inverted input signal $\overline{V}HD\ IN$ is connected directly to a first input 32 of a NOR gate 34. The inverted input signal $\overline{V}HD\ IN$ is also applied through the delay input 26A of the non-inverting delay circuit 26, with the inverted delay signal $\overline{V}_{IN}(DELAY)$ being applied to a delay input 36 of the NOR gate 34. Positive noise fluctuations occurring at the input which have a duration less than the predetermined high state delay interval of the delay path 26 are rejected, because the delay input 36 of the NOR gate 34 remains unchanged at logic high. The NOR gate 34 transitions only upon the condition that both of its inputs 32, 36 are at logic zero. This condition will not occur if the duration of the positive noise is less than the propagation delay provided by delay path 26.

According to this arrangement, a transition from logic low to logic high on the input of the ratio inverter 18 produces a logic low signal on the direct input 32 of the NOR gate 34. The delay input 36 to the NOR gate 34 remains high temporarily because of the propagation delay through the delay path 26. The output node 38 of the NOR gate 34 remains at logic low until the signal propagates through the delay path 26. After the delay interval has elapsed, the delay input 36 of the NOR gate 34 transitions from logic high to logic low, with the result that the NOR gate output 38 transitions from logic low to logic high, and consequently drives the output node 40 of the CMOS inverter 20 from logic high to logic low as N-channel MOSFET Q4 turns on.

Low state noise rejection is realized by conditionally applying the inverted driving signal $\overline{V}_{IN}$ to the input of the CMOS inverter 20 only after a predetermined low state delay interval produced by propagation through the delay path 28. In this arrangement, the inverted input signal $\overline{V}_{IN}$ is applied directly to a first input 42 of a NAND gate 44, and the inverted input signal $\overline{V}_{IN}$ is applied through the delay input 28A of the non-inverting delay path 28 to a delay input 46 of the NAND gate 44. Negative noise fluctuations occurring at the input pad 16 which have a duration less than the predetermined low state delay interval of the delay path 28 are rejected.

A low-to-high transition on the input pad 16 causes node 30 to fall to logic low. The delay inputs 36, 46 remain logic high temporarily because of the propagation delay produced by delay path 26 and delay path 28, respectively. The output node 48 of the NAND gate 44 transitions to logic high in response to the transition at node 30 from high to low, but the output node 38 of NOR gate 34 remains at logic low until the input signal has propagated through the delay path 26 and causes the input node 36 to fall to logic low. After input 36 has transitioned to logic low, the output of NOR gate 34 rises to logic high, thereby turning on N-channel MOSFET Q4 and turning off P-channel MOSFET Q2. At the same time, output 48 of the NAND gate 44 has been at logic high, with the P-channel MOSFET Q1 remaining off and turning on N-channel MOSFET Q3. $V_{DD}$ is already removed when node 48 goes high, with the series connected N-channel MOSFETs Q3, Q4 driving the output node 40 to $V_{SS}$.

While the input signal $V_{IN}$ propagates from the common input node 30 to the delay input 36, the inverter output node 40 is held stable by a latch 50 formed by a cross-coupled combination of inverters 50A, 50B. In the absence of feedback inverter 50B, the output node 40 would be in a high impedance state and would be maintained in the high impedance state temporarily by the capacitance at node 40. For maximum noise immunity however, the feedback inverter 50B is preferably connected across the inverter 50A to prevent inadvertent coupling of node 40 while it is in the high impedance state.

Figure 3:
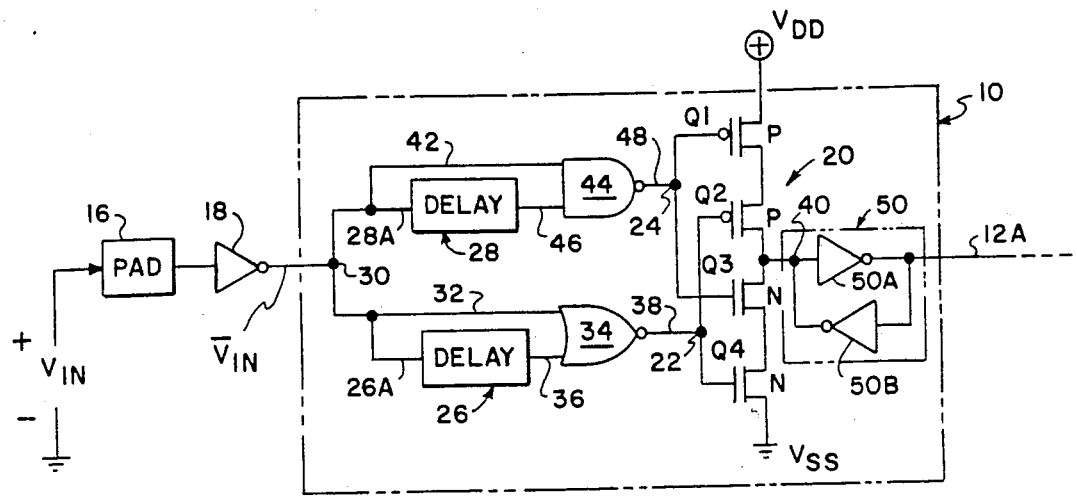
FIG. 3 is a schematic circuit diagram of the noise tolerant input buffer circuit shown in FIG. 1.

Referring to FIG. 3, a high-to-low transition on the input pad 16 causes the common input node 30 of the interface circuit 10 to rise to logic high. The logic high signal is conducted directly to the first input 42 of the NAND gate 44, but the delay input 46 remains at logic low temporarily because of the propagation delay through delay path 28. Consequently, the output node 48 of the NAND gate 44 remains at logic high during the propagation delay interval.

During the delay interval, the output 38 of the NOR gate 34 is at logic low. Accordingly, the inverter 20 is in an indeterminate condition, with the P-channel MOSFET Q1 being turned off by the logic high level on NAND gate output 48, and the N-channel MOSFET Q4 being turned off by the logic low level on the output 38 of NOR gate 34. The latch 50 maintains the preexisting logic low level on inverter output 40 during the propagation delay interval.

After the signal $V_{IN}$ propagates through the high state delay path 26, the delay input 36 of NOR gate 34 transitions to logic high, and the output of NOR gate 34 remains at logic low. However, after the inverted input signal $\overline{V}_{IN}$ propagates through the low state delay path 28, the delay input 46 to the NAND gate 44 transitions to logic high, thereby driving the NAND gate output 48 to logic low. As this transition occurs, N-channel MOSFET Q4 remains off, and N-channel MOSFET Q3 is turned off. P-channel MOSFET Q1 is turned on, with the result that the series connected P-channel MOSFET Q1 and Q2 drive output node 40 to logic high ($+V_{DD}$). The logic high level on inverter output node 40 is maintained until the next transition.

A high state transition, that is a transition from logic low to logic high, will be accepted as a valid signal or will be rejected as noise, depending upon the duration of the positive going component. Referring again to FIG. 3, a transition from logic low to logic high at input pad 16 produces a transition from logic high to logic low at the input node 30, by operation of the ratio inverter 18. The logic low signal appears simultaneously at the direct input 42 of NAND gate 44 and the direct input 32 of the NOR gate 34. The delay input node 46 of NAND gate 44 remains at logic high, at least until the inverted signal propagates through the delay path 28. Likewise, the delay input 36 of NOR gate 34 remains at logic high, at least until the inverted input signal propagates through the delay path 26. Under this condition, the output 48 of the NAND gate 44 is logic high, and the output 38 of the NOR gate 34 is at logic low.

With a logic high being applied to the low state input 24, P-channel MOSFET Q1 is turned off, and N-channel MOSFET Q3 is turned on. Likewise, with a logic low input to the high state input 22, P-channel MOSFET Q2 is turned on and N-channel MOSFET Q4 is turned off. The inverter 20 is thus in an indeterminate state, and its output node 40 is latched to the preexisting logic high level ($V_{CC}$). If the positive going transition on pad 16 is a noise signal having a duration less than the propagation delay interval, the output node 40 of the inverter 20 will be held at its preexisting logic high level by the latch 50. If, however, the positive going component should persist longer than the propagation delay through delay path 26, it will be accepted as a valid signal, as the delay input 36 of the NOR gate 34 transitions from logic high to logic low.

When that occurs, the NOR gate transitions from logic low to logic high, thereby turning off P-channel MOSFET Q2 and turning on N-channel MOSFET Q4. Propagation of the inverted input signal $V_{IN}$ through the delay path 28 causes the delay input 46 to transition from logic high to logic low. The logic high output of NAND gate 48 remains at logic high, with the result that P-channel MOSFET Q1 remains off and N-channel MOSFET Q3 remains on. Accordingly, the input signal transitioning from logic low to logic high will be accepted as a valid signal only if it persists longer than the propagation delay imposed by delay path 26. All other such transitions are rejected, with the result that the logic output 38 of the NOR gate 34 remains at logic low and the logic output of NAND gate 48 remains at logic high, and the output node 40 of the inverter remains at its preexisting logic level by the latch 50.

A transition from logic high to logic low at the input pad 16 will produce a logic high at the common input node 30, the direct input 42 of NAND gate 44 and the direct input 32 of NOR gate 34. During the delay interval, the delay input 46 of the NAND gate 44 is at logic low, and the delay input 36 of the NOR gate 34 is at logic low. This produces a logic high at the NAND gate output 48 and a logic low at the NOR gate output 38. Accordingly, during the delay interval, P-channel MOSFET Q1 is turned off, N-channel MOSFET Q3 is turned on, P-channel MOSFET Q2 is turned on and N-channel MOSFET Q4 is turned off. Thus, during the delay interval, the output node 40 of the inverter 20 is "floating", and is maintained at its preexisting logic level by the latch 50.

The negative going or high-to-low transition component will be accepted as a valid signal if it persists longer than the propagation delay of delay path 28. The negative going component is inverted and is applied as a positive going signal at the input of delay path 28. If the duration of the input signal is less than the propagation delay of input delay path 28, the transition will be rejected and the inverter output 40 will remain unchanged. However, should the duration of the negative going signal be longer than the propagation delay of delay path 28, at the end of the delay, it causes a transition of NAND gate input 46 from logic low to logic high, thereby causing a transition from logic high to logic low at the NAND gate output 48.

Such a high-to-low transition at the inverter input 24 causes P-channel MOSFET Q1 to turn on, and N-channel MOSFET Q3 to turn off. The inverted input signal causes the delay input 36 of NOR gate 34 to transition from low to high, but the output of the NOR gate 34 remains at logic low. Thus, P-channel MOSFET Q1 and P-channel MOSFET Q2 are turned on, and N-channel MOSFETs Q3 and Q4 are turned off, thus driving the inverter output node 40 from logic low to logic high.

Accordingly, the NOR gate 34 in combination with the delay path 26 defines a high state buffer, and the NAND gate 44 in combination with the delay path 28 defines a low state buffer. Each buffer requires that the input transition signal must have a duration substantial enough to be accepted as a valid input change. The length of the delay path in the high state delay path 26 and the low state delay path 28 are set to the maximum length of noise pulse which is desired to be rejected. The propagation delay will vary depending upon the specific application, device type and speed requirement of the circuit. The delay path 28 is preferably implemented by series connected pairs of inverters to provide the desired propagation delay interval.

Some transient noise signals exhibit a ringing effect wherein it is characterized by multiple transitions between logic low and logic high over a time interval which may exceed the predetermined propagation delay interval. Although one or more transitioning components of such ringing noise may fail to propagate through the delay path during the limited delay interval, a ringing noise signal could have a component in proper transitioning phase relationship which may occur after the predetermined delay interval, thus driving either the high state NOR gate 34 or the low state NAND gate 44. Such ringing noise is sometimes referred to as "supply bounce" which is generated in response to stray inductance associated with conductive traces, package-to-ground leads, and power conductors from $V_{DD}$. Such stray inductance produces current surges that cause Ldi/dt voltage drops which appear as bounce ringing on the supply ($V_{DD}$) or on ground ($V_{SS}$).

Figure 4:
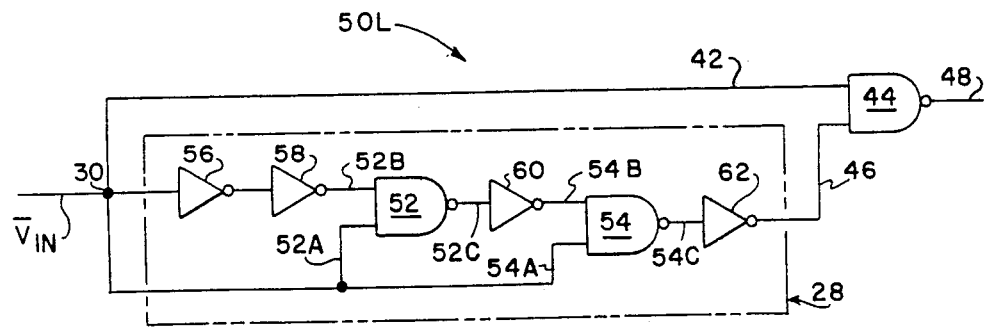
FIG. 4 is a schematic circuit diagram of a low state noise buffer.

The ringing noise problem is overcome by a low state buffer circuit 50L having a delay circuit 28 which includes a cascaded combination of NAND gates and inverters. In the preferred embodiment shown in FIG. 4, a pair of NAND gates 52, 54 are cascaded together with one input 52A and 54A of each NAND gate being connected in common to the common input node 30. One or more inverters, for example, inverters 56, 58 and 60, are connected in series with the other input of each NAND gate 52, 54, respectively. Finally, an inverter 62 is connected in series with the output node 54C of NAND gate 54, so that the delay input 46 to NAND gate 44 is in phase with the inverted signal $V_{IN}$. Each inverter and NAND gate introduces a predetermined amount of propagation delay within the delay circuit 28. An appropriate number of inverters and NAND gates are cascaded in the manner as shown in FIG. 4 to yield the desired propagation delay.

The delay circuit 28 is resettable and is reinitialized to accommodate the ringing nature of low state noise which may appear across the input pad 16. When a logical transition of the input signal $V_{IN}$ occurs from logic high to logic low, the inverter input node 30 transitions from logic low to logic high. The logic high signal is applied immediately to input node 42 of NAND gate 44. However, the input signal must propagate through the entire propagation path of delay circuit 28 before NOR gate input 46 transitions from logic low to logic high.

At transition, input 52A and input 54A transition from logic low to logic high. Input 52B transitions from logic low to logic high only after propagation through inverters 56, 58. After the propagation delay, the output 52C of the first NAND gate 52 transitions from logic high to logic low. After propagation through the inverter 60, the input 54B of NAND gate 54 rises from logic low to logic high. After propagation through the NAND gate 54, its output 54C transitions from logic high to logic low. After propagation through inverter 62, its output 46 transitions from logic low to logic high, thereby causing a transition from logic high to logic low at the output 48 of NAND gate 44, thereby turning on P-channel MOSFET Q1 and turning off N-channel MOSFET Q3 as previously described.

If the signal being applied to input pad 16 has a ringing component, the ringing component will produce a transition from logic high to logic low at input node 30 and at NAND gate inputs 52A, 54A, thereby instantly resetting NAND gates 52, 54. That is, immediately upon such a transition, the output of both NAND gates 52, 54 transitions from low to high, with the result that the delay input node 46 transitions from high to low, causing the NAND gate output node 48 to stay high. Thus the next succeeding component of a ringing noise signal must travel through the entire delay path before the desired logical transition at output node 48 is produced. Accordingly, as long as each ringing component has a duration less than the propagation delay of delay circuit 28, it will be rejected and the output node 40 of the inverter 20 will remain unchanged.

Figure 5:
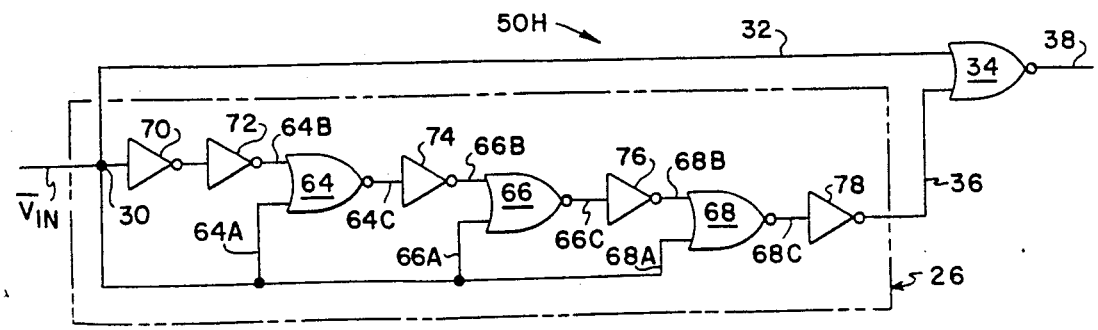
FIG. 5 is a schematic circuit diagram of a high state noise buffer.

A preferred embodiment for the high state buffer circuit 50H is illustrated in FIG. 5. The high state buffer circuit 50H includes a delay circuit 26 having a cascaded combination of NOR gates 64, 66 and 68 together with an appropriate number of inverters 70, 72, 74, 76 and 78 which in combination with the cascaded NOR gates will yield the desired delay interval. According to this arrangement, one input 64A, 66A, 68A of each NOR gate 64, 66, 68, respectively, is connected in common to the driving signal $V_{IN}$, with a second input of each NOR gate being coupled to the driving input node 30 and to each other by the inverters 70, 72, 74 and 76. The inverted input $V_{IN}$ is applied directly to the input 32 of NOR gate 34, and is also applied through the delay circuit 26.

According to this arrangement, a high-to-low transition occurs at NOR gate input 32 while the delay input 36 remains at logic high. During the propagation delay interval, the output 38 of NOR gate 34 remains at logic low, thereby maintaining P-channel MOSFET Q2 in on condition and maintaining N-channel MOSFET Q4 in off condition. As shown in FIG. 5, the input signal $V_{IN}$ must propagate through the entire delay circuit 26 before NOR gate input 36 transitions from high to low. That is, after transition from high to low, NOR gate input 64A, 66A and 68A are at logic low, and NOR gate input 36 is at logic high. After the signal $V_{IN}$ propagates through inverter 70 and inverter 72, NOR gate input 64B transitions from logic high to logic low, thereby driving its output 64C to logic high.

After propagation through the inverter 74, the input 66B transitions to logic low, thereby driving the NOR gate output 66C to logic high. After propagation through inverter 76, the NOR gate input 68B transitions to logic low, thereby driving its output 68C to logic high. After propagation through the inverter 78, the NOR gate delay input 36 transitions from logic high to logic low, thereby causing NOR gate output 38 to transition from logic low to logic high. After application of the logic high output signal to the common gate node 22, the P-channel MOSFET Q2 is turned off and the N-channel MOSFET Q4 is turned on, as previously discussed.

It will be appreciated, however, that upon the occurrence of ringing noise having negative going components, that one or more of the negative going components may occur outside of the predetermined delay interval established by delay circuit 26, thereby inadvertently driving the inverter 20 to produce an invalid logic condition at output node 40. However, it will be seen by inspection of FIG. 5 that, should ringing noise occur having a negative component or a high-to-low transition component occurring outside of the predetermined delay interval, the delay circuit 26 will be automatically reset upon the occurrence of the first high-to-low transition. After inversion by the ratio inverter 18, such a transition will produce a logic high at each input 64A, 66A, 68A of the NOR gates 64, 66, 68, respectively. This produces a logic low at the output node 68C, thereby driving the NOR gate input 36 to logic high and driving its output to logic low. By this arrangement, ringing noise having negative components or high-to-low transition components will have no effect on the operation of the inverter 20, provided that the duration of any such ringing component be less than the predetermined delay interval established by the cascaded combination of NOR gates and inverters.

In the worst case, the propagation delay paths 26, 28 are reset after at most two gate delays. That is, in the low state buffer 50L as shown in FIG. 4, the ringing noise component could occur during the interval that the signal is being propagated through the NAND gate 54 and the inverter 62. In that case, reset would occur after that slight propagation delay. Likewise, the ringing noise component could occur during propagation of the ringing noise signal through the NOR gate 68 and inverter 78. In that instance, reset would be delayed at most by the gate delay associated with the NOR gate 68 and inverter 78. At all other times, the occurrence of a ringing noise component would immediately reset the delay path. Multiple delay elements may be used, depending upon the expected duration of the ringing noise signal.

Although the invention has been described with reference to certain specific embodiments, and with reference to circuits implemented by CMOS technology, the foregoing description is not intended to be construed in a limiting sense. Various modifications of the disclosed input buffer circuit as well as alternative applications thereof will be suggested to persons skilled in the art by the foregoing specification and illustrations. It is therefore contemplated that the appended claims will cover any such modifications or embodiments that fall within the true scope of the invention.

What is claimed is:

1. A noise tolerant interface circuit having an input node and an output node comprising, in combination:
an inverter having first and second complementary transistors, said first transistor having a source terminal for coupling to a positive supply terminal, a drain terminal and a gate terminal, and said second transistor having a source terminal for coupling to a reference potential, a drain terminal and gate terminal, the drain terminal of the first transistor being "coupled" to the drain terminal of the second transistor, and the gate terminals of said first and second transistors being connected in common;

a first NOR gate having direct and delay input terminals and an output terminal, said direct input terminal being connected to the input node of said interface circuit and said NOR gate output terminal being connected to the common gate input terminal of said inverter;

delay means having a delay input terminal connected to said interface input node and a delay output terminal connected to the delay input terminal of said NOR gate for enabling said NOR gate upon the elapse of a predetermined time interval after a signal is applied to said interface circuit input node;

said delay means including a second NOR gate having direct and delay input terminals and an output terminal, said direct input terminal of said second NOR gate being connected to said interface circuit input node; and a plurality of inverters connected in electrical series relation between said interface input node and the delay input terminal of said second NOR gate, the output terminal of said second NOR gate being coupled to the delay input of said first NOR gate.

2. A noise tolerant interface circuit as defined in claim 1, wherein said first transistor is a P-channel MOS field effect transistor, and wherein said second transistor is an N-channel MOS field effect transistor.

3. A noise tolerant interface circuit as defined in claim 1, wherein said first and second complementary transistors are MOS insulated-gate, enhancement mode field effect transistors.

4. A noise tolerant interface circuit as defined in claim 1, wherein the output node of said interface circuit is connected to the commonly connected drain terminals of the first and second complementary transistors, and including:

a latch coupled to the output node of said interface circuit.

5. A noise tolerant interface circuit having an input node and an output node comprising, in combination:

an inverter having first and second complementary transistors, said first transistor having a source terminal for coupling to a positive supply terminals, a drain terminal and a gate terminal, and said second transistor having a source electrode for coupling to a reference potential, a drain terminal and a gate terminal, the drain terminal of the first transistor being coupled to the drain terminal of the second transistor, and the gate terminals of said first and second transistors being connected in common;

a first NAND gate having direct and delay input terminals and an output terminal, said direct input terminal being connected to the input node of said interface circuit and its output terminal being connected to the common gate input of said inverter;

delay means having a delay input terminal connected to said interface input node and a delay output terminal connected to the delay input of said NAND gate for enabling said NAND gate upon the elapse of a predetermined time interval after a signal is applied to said interface input node;

said delay means including a second NAND gate having direct and delay input nodes and an output node, said direct input node of the second NAND gate being coupled to said interface circuit input node; and, a plurality of inverters connected in electrical series relation between said interface circuit input node and the delay input terminal of said second NAND gate, the output terminal of said second NAND gate being coupled to the delay input of said first NAND gate.

6. A noise tolerant interface circuit as defined in claim 5, wherein said first transistor is a P-channel MOS field effect transistor, and wherein said second transistor is an N-channel MOS field effect transistor.

7. A noise tolerant interface circuit as defined in claim 5, wherein said first and second complementary transistors are MOS insulated-gate, enhancement mode field effect transistors.

8. A noise tolerant interface circuit as defined in claim 5, wherein the output node of said interface circuit is connected to the commonly connected drain terminals of the first and second complementary transistors, and including:

a latch coupled to the output node of said buffer circuit.

9. In an interface circuit of the type having an input node, an output node and an inverter having a gate input coupled to said interface input node and an output node coupled to said interface output node for producing an output signal said interface output node which is the logical inversion of an input signal applied to said interface input node, the improvement comprising a high state noise bugger connected between the input node of said interface circuit and the gate input of said inverter, said high state noise buffer including a NOR gate having direct and delay input terminals and an output terminal, the direct input terminal of said NOR gate being coupled to the input node of said interface circuit, and the output node of said NOR gate being coupled to the gate input of said inverter; and, delay means having a delay input terminal connected to said interface input node and a delay output terminal connected to the delay input of said NOR gate;

said delay means including a second NOR gate having direct and delay input terminals and an output terminal, said direct input terminal of said second NOR gate being coupled to said interface circuit input node; and, a plurality of inverters being connected in electrical series relation between said interface circuit input node and the delay input terminal of said second NOR gate, the output terminal of said second NOR gate being coupled to the delay input of said first NOR gate.

10. In an interface circuit of the type having an input node, an output node and an inverter having a gate input coupled to said interface input node and an output node coupled to said interface output node for producing an output signal on said interface output node which is the logical inversion of an input signal applied to said interface input node, the improvement comprising a low state noise buffer connected between the input node of said interface circuit and the input gate of said inverter, said low state noise buffer including a NAND gate having direct and delay input terminals and an output terminal, the direct input terminal of said NAND gate being coupled to the input node of said interface circuit, and the output node of said NAND gate being coupled to the gate input of said inverter; and, delay means having a delay input terminal connected to said interface input node and a delay output terminal connected to the delay input of said NAND gate;

said delay means including a second NAND gate having direct and delay input terminals and an output terminal, said direct input terminal of said second NAND gate being coupled to said interface circuit input node; and, a plurality of inverters being connected in electrical series relation between said interface circuit input node and the delay input terminal of said second NAND gate, the output terminal of said second NAND gate being coupled to the delay input of said first NAND gate.

11. A high state buffer circuit for conditionally conducting an input signal from a first circuit node to a second circuit node comprising, in combination:

a first NOR gate having a direct input terminal, a delay input terminal and an output terminal, said direct input terminal being connected to the first circuit node and said NOR gate output terminal being connected to said second circuit nodes delay means having a delay input terminal connected to said first circuit node and a delay output terminal connected to the delay input terminal of said first NOR gate for enabling said NOR gate upon the elapse of a predetermined time interval after a signal is applied to said first circuit node;

said delay means including a second NOR gate having direct and delay input terminals and an output terminal, said direct input terminal of said second NOR gate being connected to said first circuit node; and, a plurality of inverters being connected in electrical series relation between said first circuit node and the delay input terminal of said second NOR gate, the output terminal of said second NOR gate being coupled to the delay input of said first NOR gate.

12. A low state buffer circuit for conditionally conducting an input signal from a first circuit node to a second circuit node comprising, in combination:

a first NAND gate having direct input terminal, a delay input terminal and an output terminal, said direct input terminal being connected to the first circuit node and its output terminal being connected to said circuit node;

delay means having a delay input terminal connected to said first circuit node and a delay output terminal connected to said second circuit node for enabling said NAND gate upon the elapse of a redetermined time interval after a signal is applied to said first circuit node;

said delay means including a second NAND gate having direct and delay input nodes and an output node, said direct input node of the second NAND gate being coupled to said first circuit node; and, a plurality of inverters connected in electrical series relation between said first circuit node and the delay input terminal of said second NAND gate, the output terminal of the second NAND gate being coupled to the delay input of said first NAND gate.

13. A noise tolerant interface circuit having an input node and an output node comprising, in combination:

a compound inverter having first and second pairs of complementary transistors, the first transistor of the first pair having a source terminal for coupling to a positive supply terminal, a drain terminal and a gate terminal, and the second transistor of said first pair having a source terminal connected to the drain terminal of the first transistor of the first pair, a drain terminal and a gate terminal, and the first transistor of said second pair having a source terminal for coupling to a reference potential, a drain terminal and a gate terminal, and the second transistor of the second pair having a source terminal connected to the drain terminal of the first transistor of the second pair, and the drain terminals of the second transistors of the first and second transistor pairs being connected in common, the gate terminal of the first transistor in the first pair being connected in common with the gate terminal of the first transistor in the second pair thereby defining a first common gate input node, and the gate terminals of the second transistors of the first pair and second pair being connected in common, thereby defining a second common gate input node;

a first NOR gate having direct and delay input terminals and an output terminal, said direct input terminal being connected to the input node of said interface circuit and said NOR gate output terminal being connected to a selected one of the first and second common gate input nodes;

a first NAND gate having direct and delay input terminals and an output terminal, said direct input terminal being connected to the input node of said interface circuit and its output terminal being connected to the other one of the first and second common gate input nodes;

first delay means having a delay input terminal connected to said interface circuit input node and a delay output terminal connected to the delay input terminal of said NOR gate for enabling said NOR gate upon the elapse of a predetermined time interval after a signal is applied to said interface input node; and, second delay means having a delay input terminal connected to said interface circuit input node and a delay output terminal connected to the delay input of said NAND gate for enabling said NAND gate upon the elapse of a predetermined time interval after a signal is applied to said interface circuit input node.

14. A noise tolerant interface circuit as defined in claim 13, wherein said first delay means comprising a second NOR gate having direct and delay input terminals and an output terminal, said direct input terminal of said second NOR gate being connected to said interface input node; and, a plurality of inverters connected in electrical series relation between said interface input node and the delay input terminal of said second NOR gate, the output terminal of the second NOR gate being coupled to the delay input of said first NOR gate.

15. A noise tolerant interface circuit as defined in claim 13, wherein said second delay means comprising a second NAND gate having direct and delay input nodes and an output node, said direct input node of said second NAND gate being coupled to said interface input node; and including a plurality of inverters connected in electrical series relation between said interface input node and the delay input terminal of said second NAND gate, the output terminal of said second NAND gate being coupled to the delay input of said first NAND gate.

16. A noise tolerant interface circuit as defined in claim 13, wherein the output node of said interface circuit is connected to the commonly connected drain terminals of the complementary transistors of said first and second pairs, and including:

a latch coupled to the output node of said interface circuit.

* * * * *